US006915151B2

(12) United States Patent
Baumgardner et al.

(10) Patent No.: US 6,915,151 B2
(45) Date of Patent: Jul. 5, 2005

(54) QUANTITATIVE PULMONARY IMAGING

(75) Inventors: James Baumgardner, Milmont Park, PA (US); David Lipson, Wynnewood, PA (US); Rahim Rizi, Montgomeryville, PA (US); David Roberts, Rosemont, PA (US); Mitchell Schnall, Broomall, PA (US)

(73) Assignee: Trustees of the University of Pennsylvania, Philadelphia, PA (US)

( * ) Notice: Subject to any disclaimer, the term of this patent is extended or adjusted under 35 U.S.C. 154(b) by 373 days.

(21) Appl. No.: 10/071,434

(22) Filed: Feb. 8, 2002

(65) Prior Publication Data

US 2002/0198449 A1 Dec. 26, 2002

Related U.S. Application Data

(60) Provisional application No. 60/267,282, filed on Feb. 8, 2001.

(51) Int. Cl.[7] .............................................. A61B 5/055
(52) U.S. Cl. ........................ 600/420; 424/9.3; 324/307; 324/309
(58) Field of Search ................................ 324/307, 309; 600/410, 419, 420, 431; 128/920, 922; 382/128, 132; 424/9.3

(56) References Cited

U.S. PATENT DOCUMENTS

| | | | | |
|---|---|---|---|---|
| 5,402,785 A | * | 4/1995 | Leigh et al. | 600/419 |
| 5,974,165 A | * | 10/1999 | Giger et al. | 382/132 |
| 6,271,665 B1 | * | 8/2001 | Berr et al. | 324/306 |
| 6,370,415 B1 | * | 4/2002 | Weiler et al. | 600/410 |
| 6,426,058 B1 | * | 7/2002 | Pines et al. | 424/9.3 |
| 2003/0023162 A1 | * | 1/2003 | Baumgardner et al. | 600/431 |
| 2003/0064023 A1 | * | 4/2003 | Driehuys et al. | 424/9.3 |

OTHER PUBLICATIONS

Cremillieu et al. "A Combined 1H Perfusion/3HE Ventilation NMR Study in Rat Lungs" Magnetic Resonance in Medicine 41:645–648 (1999).*
Maki et al. "Recent Advances in Pulmonary Imaging" Chest; Nov. 1999; 116, 5 pp. 1388–1402.*
Viallon et al. "Laser–Polarized 3He as a Probe for Dynamic Regional Measurements of Lung Perfusion and Ventilation Using Magnetic Resonance Imaging" Magnetic Resonance in Medicine 44:1–4 (2000).*
Hatabu et al. "Quantitative Assessment of Pulmonary Perfusion With Dynamic Contrast–Enhanced MRI" Magnetic Resonance in Medicine 42:1033–1038 (1999).*
Rizi et al. "Co–registration of Acquired MR Ventilation and Perfusion Images—Validation in a Porcine Model" Magnetic Resonance in Medicine 49: 13–18 (2003).*
Rizi et al. "Determination of Regional Va/Q by Hyperpolarized 3He MRI" Magnetic Resonance in Medicine 52:65–72 (2004).*
Altes, T.A., et al, "Hyperpolarized [3]He MR Lung Ventilation Imaging in Asthmatics: Preliminary Findings," *J. Mag. Res. Imag.* 13(3):378–384 (2001).
Black,R.D., et al, "In vivo He–3 MR Images of Guinea Pig Lungs," *Rad* 199(3):867–870 (1996).
de Lange, E.E., et al, "Lung Air Spaces: MR Imaging Evaluation With Hyperpolarized 3He Gas," *Rad* 210(3):851–857 (1999).
Gierada, D.S., et al, "Dynamic Echo Planar MR Imaging of Lung Ventilation With Hyperpolarized (3)He in Normal Subjects and Patients With Severe Emphysema," *NMR Biomed.* 13(4):176–181 (2000).
Kauczor, H.U., et al, "Imaging of the Lungs Using 3He MRI: Preliminary Clinical Experience in 18 Patients With and Without Lung Disease," *J. Mag. Res. Imag.* 7:538–543 (1997).
Kauczor, H.U., et al, "Normal and Abnormal Pulmonary Ventilation: Visualization at Hyperpolarized He–3 MR Imaging," *Rad* 201:564–568 (1996).
MacFall, J.R., et al, "Human Lung Air Spaces: Potential For MR Imaging With Hyperpolarized He–3," *Rad* 200:553–558 (1996).
Middleton, H., et al, "MR Imaging With Hyperpolarized [3]He Gas," *Mag. Res. Med.* 33:271–275 (1995).
Roberts, D.A., et al, "Detection and Localization of Pulmonary Air Leaks Using Laser–Polarized Helium–3 MRI," *Mag. Res. Med.* 44(3):379–382 (2000).
Salerno, M., et al, "Dynamic Spiral MRI of Pulmonary Gas Flow Using Hyperpolarized [3]He:Preliminary Studies in Healthy and Diseased Lungs," *Mag. Res. Med.* 46:667–677 (2001).

* cited by examiner

*Primary Examiner*—Shawna J. Shaw
(74) *Attorney, Agent, or Firm*—Evelyn H. McConathy, Esq.; Drinker Biddle & Reath LLP

(57) ABSTRACT

The present invention comprises imaging and quantitative measurement of lung ventilation, particularly in a human lung. Methods for quantitative imaging of lung ventilation, and the further provided systems and algorithmic tools therefore, comprise three primary components: the combined MRI ventilation/perfusion (V/Q) imaging techniques using hyperpolarized helium-3 ($^3$He) gas (H$^3$He); the three-dimensional quantitative imaging of absolute lung perfusion (Q) and collection of local magnetic resonance image data therefrom to produce an absolute lung perfusion image data; and the algorithmic co-registration of the two image data sets, (HP-$^3$He MRI image of V/Q and MR imaging of quantitative perfusion (Q) in the lung). From the data acquired in the combined data sets and their spatial co-registration, absolute ventilation (V) is computed.

12 Claims, 4 Drawing Sheets

QUANTITATIVE PULMONARY IMAGING

REFERENCE TO RELATED APPLICATIONS

This application claims priority to No. 60/267,282 filed Feb. 8, 2001, herein incorporated by reference in its entirety.

GOVERNMENT INTERESTS

This invention was supported in part by Grant Nos. K23 HL04486, RR02305, and R01-HL-64741 from the U.S. National Institutes of Health. The Government may have certain rights in this invention.

FIELD OF THE INVENTION

The present invention provides a novel non-invasive method to quantitatively evaluate pulmonary ventilation and perfusion, combining the use of a hyperpolarized noble gas for ventilation MR images and arterial spin-tagging for perfusion MR imaging. Also provided are the algorithmic tools necessary to calculate the quantitative imaging of lung ventilation.

BACKGROUND OF THE INVENTION

The accurate measurement of pulmonary ventilation (V), perfusion (Q), and V/Q distribution is of great importance in medicine. V/Q relationships are used to diagnose and treat pulmonary disorders, including emphysema, asthma and pulmonary embolus. Established methods for anatomic study of gas exchange in the human lung include conventional planar ventilation and perfusion nuclear scanning (V/Q scans) and single photon emission-computed tomography (SPECT). However, existing techniques have well-documented, clinically significant limitations. Moreover they are unfortunately limited in spatial resolution, and they involve the mandatory exposure of both the patient and the practitioner to radioactive agents. They also require prolonged breathing from an increased resistance closed system through a tight-fitting facemask, an effort that some patients with advanced emphysema are unable to tolerate.

Normally, pulmonary artery blood flows through capillaries that are immediately proximate to alveoli. For gas exchange to occur efficiently, alveolar ventilation and pulmonary blood flow are proportionally matched. When V/Q mismatch occurs, the terms "shunting" or "dead space" are used to describe the abnormalities in V or Q, respectively. Shunting occurs when unventilated or collapsed alveoli cannot participate in gas exchange (i.e., unloading carbon dioxide and absorbing oxygen), so that there is diversion in the blood flow. Likewise, without blood flow to an alveolus, wasted ventilation or dead space occurs. While small amounts of shunting (e.g., in the bronchial vessels) and dead space (e.g., in the nasopharyx) are normal, a significant number of pathological pulmonary conditions are characterized by V/Q mismatches.

Pulmonary functional imaging methods include qualitative tests that provide valuable clinical information, but each currently available test has a limitation. The radionuclide V/Q scan has inherently poor spatial relations, lacks the ability to image cross-sectional views, and deposits radiolabeled aerosols in the central airways of the patient, causing errors. SPECT has the highest resolution of all of the known methods, but accurate detection of pulmonary disorders still demands even higher resolution than is currently provided. Global pulmonary function may be determined by the multiple inert gas elimination technique (MIGET), which provides a quantitative measurement of pulmonary V/Q ratios based upon a mathematical subdivision of the lung into fifty hypothetical segments. It is the gold-standard physiological test of lung V/Q relationships, but even MIGET has characteristic and problematic limitations, which have prevented its widespread clinical application. For instance, large blood sample volumes are necessary for the analysis.

Ventilation scanning using non-radioactive xenon gas and ultrafast computed tomography has been described (Murphy et al., *Chest* 96:799–804 (1989), but requires exposure to radiation in the form of x-rays. Low signal intensity and the effects of respiratory motion have likewise limited conventional proton MR imaging of human airways and the pulmonary parenchyma (Bergin et al., *Radiology* 179:777–781 (1991); Bergin et al., *Radiology* 180: 845–848 (1991); Bergin et al., *J. Thorac. Imag.* 8:12–17 (1993); Alsop et al., *Magn. Reson. Med.* 33: 678–682 (1995)).

The use of hyperpolarized noble gases, such as $^3$He, has been demonstrated to be useful in the imaging of gas distribution (ventilation) in the human lung (Middleton et al., *Mag. Res. Med.* 33:271–275 (1995); MacFall et al., *Rad* 200:553–558 (1996); Kauczor et al., *Rad* 201:564–568 (1996); Kauczor et al., *J. Mag. Res. Imag.* 7:538–543 (1997); Roberts et al., *Mag. Res. Med.* 44(3):379–382 (2000); Black et al., *Rad* 199(3):867–870 (1996); de Lange et al., *Rad* 210(3):851–857 (1999); Altes et al., *J. Mag. Res. Imag.* 13(3):378–384 (2001); Salerno et al., *Mag. Res. Med.* 46:667–677 (2001); Gierada et al., *NMR Biomed.* 13(4):176–181 (2000)). When hyperpolarized helium-3 (HP-$^3$He) has been used in the lung, regional oxygen partial pressure (O$_2$) has been calculated from the intensity of the HP-$^3$He magnetic resonance (MR) images, but it has not been previously applied to V/Q measurements.

Thus, the ideal radiologic method for assessing gas exchange would quantify the comparison of V/Q in small volumetric zones of the lung. It would be safe, non-invasive, rapid, easily applied, reproducible and tolerable to patients with advanced lung disease. To date, no available technique met all of these requirements.

Arterial blood perfusion imaging can be obtained by noninvasive magnetic labeling of blood using the arterial spin-tagging (AST) technique (see, e.g., U.S. Pat. No. 5,402,785, Leigh and Alsop). This method is based upon the steady-state magnetic labeling, or "spin-tagging" of arterial water protons (Detre et al., *NMR Biomed.* 7:75–82 (1994); Roberts et al., *Proc. Natl. Acad. Sci. USA* 91: 33–37 (1994); Roberts et al., *Proc. Fifth Scientific Meeting and Exhibition of ISMRM* 3:1764 (1997); Roberts et al., *Rad* 212(3):890–895 (1999); Detre et al., *Magn. Res. Med.* 22:37–45 (1992); Roberts et al., *J. Magn. Reson. Imag.* 14(2):175–180 (2001)).

The combined application of these two non-invasive functional MR imaging techniques would provide images of the patterns of air flow in the lungs of human or animal subjects, and aid in V/Q mapping of the lung. Prior to the present invention, however, although qualitative methods are known, no noninvasive quantitative method for imaging lung ventilation has been used or developed. Moreover V/Q by magnetic resonance imaging (MRI) would offer a new ability to uniquely describe normal lungs, to diagnose pulmonary disease, to follow the course of pulmonary diseases, and to assess therapeutic response in terms of localized V/Q (regional VIQ). Accordingly, a need has remained in the art until the present invention for a quantitative method of rapidly providing accurate V/Q images at very high resolution, and an invention meeting these needs would provide valuable insight into the pathogenesis and pathophysiology of pulmonary V/Q abnormalities and of the normal lung.

SUMMARY OF THE INVENTION

The present invention offers novel quantitative methods and tools for computing three-dimensional quantitative images of human lung ventilation. Also provided are quantitative methods for very high resolution, three-dimensional combined imaging of pulmonary ventilation (V) and perfusion (Q), synchronously (V/Q), wherein the methods comprise delivering a predetermined volume of hyperpolarized noble gas into the conducting airways in each ventilated region of the pulmonary system and collecting local magnetic resonance image data therefrom to produce a V/Q image data set.

Using an inhaled noble gas, preferably laser-hyperpolarized helium-3 ($^3$He) gas (HP-$^3$He), three-dimensional MRI images are rapidly obtained. The HP-$^3$He acts as a contrast agent, thereby providing unparalleled, high resolution images defining the air spaces.

The methods comprise three primary components, including the algorithmic tools therefore, each of which is provided in the present invention. First, the methods rely upon combined MRI ventilation/perfusion (V/Q) imaging techniques, which are provided and applied for the first time synchronously in humans in the present invention. The quantification of regional V/Q is extremely important for diagnosis and evaluation of pulmonary diseases.

A second provided component is the three-dimensional quantitative imaging of absolute lung perfusion (Q) and collecting local magnetic resonance image data therefrom to produce an absolute lung perfusion image data. In the present invention quantitative imaging of absolute lung perfusion is accomplished by any known method, including gadolinium-based methods. However, in a preferred embodiment of the invention, Q is computed using the arterial spin-tagging (AST) method of perfusion MRI.

A third provided component for the methods of the present invention is the co-registration algorithm to spatially co-register the two image data sets, (HP-$^3$He MRI image of V/Q and MR imaging of quantitative perfusion (Q) in the lung). The images of V/Q and perfusion (Q) are generally obtained at separate times and during different phases of the respiratory cycle. For this reason, a spatial co-registration algorithm of the present invention must be used to align the image data prior to calculation of ventilation.

From the data acquired in the combined data sets and their spatial co-registration resulting from the measurements and calculations of the present invention, absolute ventilation (V) is computed by multiplying the ventilation/perfusion ratio (V/Q) by perfusion (Q) for each point in the lung image, thereby producing three-dimensional quantitative images of lung ventilation.

The methods of the present invention accomplish the quantitative calculation of absolute lung ventilation by dividing the lung image into as many distinct voxels as the imaging resolution permits. Regional $PO_2$ (partial pressure of oxygen gas) and $PCO_2$ (partial pressure of carbon dioxide gas) measurements resulting from the HP-$^3$He MR images enable the calculation of regional V/Q distribution, and in particular alveolar V/Q distribution, by MRI. Then, once the ventilation/perfusion ratio (V/Q) is determined, it is multiplied by the perfusion value (Q) for each point in the lung image.

Further provided in the present invention are the very high resolution, three-dimensional images of pulmonary ventilation (V) and perfusion (Q) in the lung, produced by the foregoing methods using hyperpolarized HP-$^3$He gas.

In addition, systems are provided for producing the very high resolution, three-dimensional images of pulmonary ventilation (V) in the lung in accordance with claim 8, comprising: means for collecting and processing magnetic resonance imaging data from the hyperpolarized H$^3$He gas-infused lung, conducting airways and ventilated regions of the lung; means for dividing the lung images into as many distinct voxels as imaging resolution permits; means for synchronously imaging pulmonary ventilation (V) and perfusion (Q), and calculating V/Q therefrom; means for imaging of absolute lung perfusion and calculating Q therefrom; means for spatially co-registering the HP-$^3$He MR image V/Q data set with data set Q for quantitative lung perfusion; and means for computing absolute ventilation (V) from the ventilation/perfusion ratio (V/Q) and perfusion (Q).

A device is also provided for post-acquisition processing of MRI-acquired high resolution, three-dimensional images of pulmonary ventilation (V) in the lung, comprising: computer-readable signal-bearing medium; means for collecting and processing magnetic resonance imaging data from a hyperpolarized H$^3$He gas-infused lung, conducting airways and ventilated regions of the lung; means for dividing the lung images into as many distinct voxels as imaging resolution permits; means for synchronously imaging pulmonary ventilation (V) and perfusion (Q), and calculating V/Q therefrom; means for imaging of absolute lung perfusion and calculating Q therefrom; means for spatially co-registering the HP-$^3$He MR image V/Q data set with data set Q for quantitative lung perfusion; and means for computing absolute ventilation (V) from the ventilation/perfusion ratio (V/Q) and perfusion (Q).

Additional objects, advantages and novel features of the invention will be set forth in part in the description, examples and figures which follow, and in part will become apparent to those skilled in the art on examination of the following, or may be learned by practice of the invention.

DESCRIPTION OF THE DRAWINGS

The foregoing summary, as well as the following detailed description of the invention, will be better understood when read in conjunction with the appended drawings. For the purpose of illustrating the invention, there are shown in the drawings, certain embodiment(s), which are presently preferred. It should be understood, however, that the invention is not limited to the precise arrangements and instrumentalities shown.

FIG. 2A depicts a sagittal proton image of the lung. The corresponding images were depicted showing $^3$He distribution (ventilation) in FIG. 2B, and perfusion via the AST technique in FIG. 2C.

DETAILED DESCRIPTION OF PREFERRED EMBODIMENTS

Figure 1:
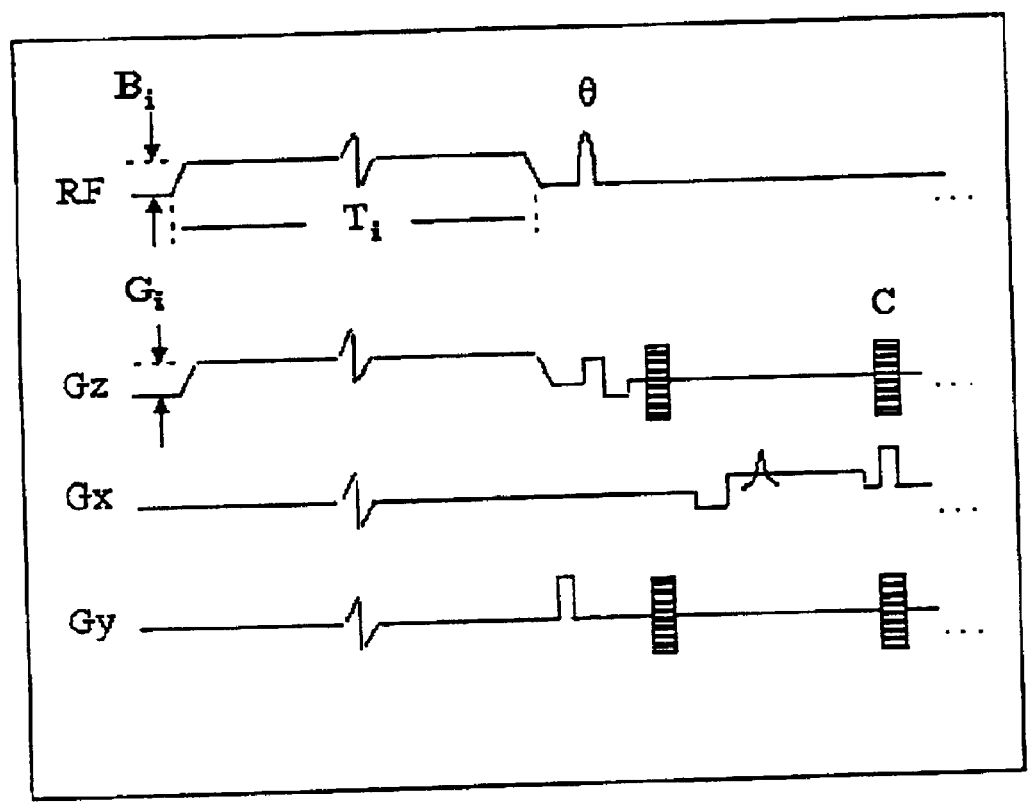
FIG. 1 depicts the three-dimensional compact, gradient-echo pulse sequence used to acquire perfusion image data showing the radiofrequency (RF) and gradient ($G_x$, $G_y$, and $G_z$) waveforms. An arterial labeling RF pulse was applied in the presence of a gradient to provide continuous magnetic labeling of pulmonary arterial blood flow. This pulse had an amplitude (Bi) of 24 mgauss and a duration (Ti) of 40 mseconds corresponding to a duty cycle of 80%. It was applied during the time between the crusher/refocusing gradient pulses (C) and the beginning of next excitation. The flip angle of the excitation pulse, α, was 30°. The time axis is not to scale.

The present invention comprises imaging and quantitative measurement of lung ventilation, particularly in a human lung. Methods for quantitative imaging of lung ventilation, and algorithmic tools therefore, comprise three primary components, each of which comprises an element of the present invention, and which will be described in greater detail below.

First, the methods rely upon combined MRI ventilation/perfusion (V/Q) imaging techniques, which are provided and applied in combined synchronous form in a patient for the first time in the present invention. Using an inhaled noble gas, preferably laser-hyperpolarized helium-3 ($^3$He) gas (HP-$^3$He), three-dimensional MRI images are rapidly obtained of V/Q in the lung.

A second component comprises the three-dimensional quantitative imaging of absolute lung perfusion (Q), such as by the gadolinium based methods, or any known method, so long as V and Q imaging are combined. In a preferred embodiment, perfusion is measured using the arterial spin-tagging (AST) method of perfusion MRI, as has been previously described in, e.g., U.S. Pat. No. 5,402,785 (herein incorporated by reference in its entirety).

A third component comprises the co-registration algorithm to spatially co-register the two image data sets (the HP-$^3$He MRI images of V/Q and the quantitative perfusion (Q) in the lung, preferably by AST MRI). Since the images of V/Q and perfusion (Q) are generally obtained at separate times and during different phases of the respiratory cycle, a spatial co-registration algorithm is needed to align the image data prior to calculation of ventilation. Finally, absolute ventilation (V) is computed by multiplying the ventilation/perfusion ratio (V/Q) by perfusion (Q) for each point in the lung image, thereby producing three-dimensional quantitative images of lung ventilation (in units of ml*g$^{-1}$*min$^{-1}$).

Preferred embodiments of the present invention produce high-resolution, three-dimensional images of pulmonary ventilation and perfusion (V/Q) in human and animal subjects using a noninvasive and nonradioactive MRI technique. The novel tools and methods for its use to evaluate pulmonary V/Q combine the use of a hyperpolarized noble gas for ventilation images and AST for perfusion imaging.

The present invention offers several advantages over existing methods for studying V/Q relationships in the human lung. The technique does not involve exposure to ionizing radiation. Thus, it avoids the risks associated with radioactivity, for both the patient and the clinician. It is completely noninvasive and, therefore, avoids the costs and risks associated with prior art methods involving gadolinium administration. However, use of the AST methods will not degrade subsequent gadolinium-based studies, such as magnetic resonance angiography. Additionally, multiple repeated images may be acquired by the present method throughout the day with no degradation of image quality. In contrast to radionuclide methods, the ability to repeat the imaging process within a short time period in the same subject permits the measurement of dynamic responses to various stimuli.

Other potential advantages include the fact that the ventilation portion of the study requires only a short breath-hold, while the AST perfusion technique does not require any patient breath-holding. This is a major advantage because many patients with pulmonary disease are simply unable to cooperate in breath-holding maneuvers, and it also makes the process useful for animal subjects.

This is the first time that these ventilation and perfusion techniques have been used simultaneously in patients to obtain functional magnetic resonance V/Q images. As such, the present invention offers great promise for evaluating apical perfusion in patients before and after lung volume reduction surgery Kotloff et al., Chest 120(5):1609–1615 (2001), or potentially for detecting pulmonary emboli. These techniques also are useful in the evaluation of patients before and after the use of bronchodilators or vasoactive substances. Moreover, this form of functional pulmonary imaging paves the way for noninvasive in vivo V/Q mapping of the human lung.

Imaging of Lung Ventilation/perfusion (V/Q) Ratio Using Laser-polarized Helium-3 Gas In the preferred embodiment of the method of the present invention, V and Q imaging is performed sequentially. The helium imaging is performed during a breath-hold to obtain gas distribution (ventilation) images, then the helium is exhaled. Perfusion imaging is then performed during normal breathing, and the AST method allows for the perfusion information to be obtained while the patient is breathing normally. Perfusion data can also be obtained using gadolinium based methods, or any known method, so long as V and Q imaging are combined.

In practice, the patient's lungs are ventilated, and imaging is performed using hyperpolarized $^3$He (HP-$^3$He). The polarized gas was inhaled by the patient while lying in a supine position in the MRI magnet device. The subjects inhaled approximately 750 cc of the HP-$^3$He gas to near total lung capacity, and after adequate mixing, the lung was imaged with a homogeneous coil for both signal transmission and reception, as described in the examples that follow.

Because time of repetition (TR) is irrelevant to polarized gas imaging, a real-time series of images is obtainable. This means that V/Q by MRI will be able to uniquely describe any focal or widespread pulmonary disease, and to define the response to therapy in terms of regional V/Q. For example, the MRI techniques associated with the present invention are particularly suited to describe alleviation of V/Q mismatch after prone positioning in adult respiratory distress syndrome (ARDS). To the medical community, functional lung studies and quantification of regional V/Q relationships have far-reaching clinical significance, offering unprecedented means to diagnose and follow the progression of pulmonary disease, as well as to regionally track the patient's response to therapy.

In a preferred method, the collected lung images are divided into as many distinct voxels as the imaging resolution permits, and the starting point for calculating local lung volume is the average signal intensity in each voxel divided by the signal intensity in the trachea. Neglected from the calculation are: (1) any signal decay due to oxygen or wall interactions; (2) any loss of helium from the gas spaces due to absorption by tissue or blood; and (3) any contribution to the signal from the tissue space within the voxel. The average concentration of HP-$^3$He in each voxel is calculated in terms of the amount of HP-$^3$He in each voxel divided by the volume of the voxel. The amount of HP-$^3$He in the voxel is simply calculated in terms of the concentration of HP-$^3$He in the gas space of the voxel multiplied by the volume of the gas space in the voxel. Assuming complete equilibration of the HP-$^3$He throughout the lung, the concentration of HP-$^3$He in the gas space of the voxel is exactly equal to the concentration of HP-$^3$He in the trachea.

MRI imaging with HP-$^3$He is ideal for the three requirements of the preferred embodiment of the method of the present invention—high resolution, high signal intensity, and rapid time resolution. Commercially-available MRI systems, such as those manufactured by GE and Siemens, and improvements thereof are well known in the art, and may be used and adapted for these methods.

The subject of the present method is a mammal. Preferably, the mammalian subject is human. The lung(s) of such subject may be either normal for mapping purposes, or injured or diseased for therapeutic or diagnostic purposes. Both halves of the subject's lung need not be in the same condition, and may be compared against each other. Alternatively, a normal lung may also be used for comparison purposes.

Regional PO$_2$ (partial pressure of oxygen gas measurements) computed from HP-$^3$He MR images enable the calculation of regional V/Q distribution by MRI. Magnetic image data are transferred by a high-speed network to a workstation computer (Silicon Graphics, Inc.), and image analysis is performed using IDL (Research Systems, Inc. Boulder, Colo.). In the $^3$He images, the normalized first breath $^3$He untake, $U^{fb}_{He}$, was computed by placing a ROI (Region of Interest) interactively around the trachea. The mean signal intensity in this ROI is measured and the magnitude images are scaled by the resulting value.

The decay of the HP-$^3$He polarized signal in a series of lung images can be modeled by taking into account three combined effects. Specifically, the loss of the Helium-3 magnetization ("signal") results from three effects: (i) radiofrequency excitation pulses ('B1', coil-dependent), (ii) the presence of molecular oxygen (O$_2$), and (iii) interactions with the alveolar wall.

Previous work by the Deninger group in Mainz, Germany (Deninger et al., *J. Magn. Reson.* 141(2):207–216 (1999); Deninger et al., NMR Biomed. 13(4):194–201 (2000)) has shown that the wall interactions (effect (iii), above) are negligible. Hence, the reduction in signal intensity is mostly due to: (i) the RF excitation on the nuclear spin polarization of HP-$^3$He in the acquisition volume, and (ii) decay in signal intensity due to relaxation between subsequent images, which is a function of the local oxygen pressure. The ratio of signal intensity in two consecutive images in a given region of interest depends not only on factors (i) and (ii), as outlined above, but also on the time interval ($\Delta t$) between subsequent acquisitions. By incorporating the combined effects of these factors on spin relaxation mechanisms, it is possible to model the dynamics of the signal in a series of lung images (Deninger et al., 1999), and thereby obtain the following equation:

$$\alpha = \left(\frac{180}{\pi}\right) \times \arccos\left[\left(q \times e^{\frac{\Delta t * \rho_{O_2}}{2.27}}\right)^{\frac{1}{r}}\right] \quad \text{(Equation 1)}$$

in which $\alpha$ is the flip angle of the RF pulse, q is the ratio of signal intensity of two consecutive images of $S_{n+1}$ and $S_n$, $\rho_{O_2}$, and r is the number of phase encoding steps in each image. Since the $\rho_{O_2}$ is constant within an imaging experiment, obtaining different measurements at constant $\rho_{O_2}$ and different flip angle $\alpha$ leads to the following equation:

$$q2/q1 = \frac{\cos^r(2\alpha)}{\cos^r \alpha} \quad \text{(Equation 2)}$$

Thus, with known $\alpha$, it is possible to calculate the regional [O$_2$] of oxygen in the lung. This method, to our knowledge, was first described and published by the Deninger group (Deninger et al., 1999; Deninger et al., 2000).

Next, the values for the V/Q ratio from the PO$_2$ measurement are computed. The average V$_A$/Q ratio (where V$_A$ is alveolar ventilation) is calculated in each voxel from the measurements of average PO$_2$ per voxel, using well-described equations of steady state exchange of O$_2$, CO$_2$, and N$_2$ to the local V$_A$/Q ratio. This is a variation of established techniques that calculate P$_A$O$_2$ (alveolar PO$_2$) from the V$_A$/Q ratio. Calculation of alveolar PO$_2$ (P$_A$O$_2$) from an assumed V$_A$/Q ratio is known as the "forward problem." Detailed techniques for performing this calculation have successfully predicted overall pulmonary gas exchange from measured V$_A$/Q distributions. Identical techniques are used to calculate V$_A$/Q ratios from measured PO$_2$.

First the numerical methods will be described for solving the forward problem, then the necessary modifications will be described for calculating V$_A$/Q from the local PO$_2$ measurements. Methods for calculating PO$_2$ and PCO$_2$ (partial pressure of carbon dioxide gas) in a homogeneous lung unit as a function of the V$_A$/Q ratio are well established, and are commonly used to predict overall physiologic gas exchange for a given V$_A$/Q ratio distribution. In the forward problem, it is assumed that V$_A$/Q is known, as a result, lung inputs, such as inspired oxygen fraction (F$_I$O$_2$), mixed venous PO$_2$ (P$_{VO2}$), and mixed venous PCO$_2$ (P$_{VCO2}$). From this assumed V$_A$/Q ratio, the object of the forward problem is to calculate the unknown alveolar gas tensions P$_A$O$_2$ and P$_A$CO$_2$. These calculations start with steady state mass balances for gas exchange. The result is four equations in four unknowns: (1) P$_A$O$_2$, (2) P$_A$CO$_2$, (3) V$_I$/Q (ratio of inspired ventilation (V$_I$ may not equal V$_A$)/local perfusion (Q)), and (4) P$_A$N$_2$ (alveolar nitrogen partial pressure). By elimination these are reduced to two equations in two unknowns, P$_A$O$_2$ and P$_A$CO$_2$. In particular, the equations relating to blood partial pressure to blood content for O$_2$ and CO$_2$ are highly nonlinear. Therefore, the two equations are expressed as two implicit functions of the two unknowns, and the system is solved iteratively using the secant method (see, e.g., *Numerical Recipes in C*, WH Press (Teukolsky, Vetterling & Flannery, ed.), Cambridge University Press, 1992).

V$_A$/Q was obtained from measured PO$_2$. The starting point is again four equations in four unknowns that result from the mass balances for steady state gas exchange. These four equations are reduced to two equations in two unknowns V$_A$/Q and P$_A$CO$_2$. In the inverse problem, the system is further reduced to one equation and one unknown. This equation again is expressed as an implicit function of the unknown P$_A$CO$_2$, and the numerical solution is obtained by the secant method. Steady state mass balance on oxygen exchange results in Equation 3.

$$((V_I/Q) \times (P_I O_2)) - ((V_A/Q) \times (P_A O_2)) = k(C_{c'O2}) - (C_{VO2}) \quad \text{(Equation 3)}$$

wherein $P_I O_2$ is inspired oxygen partial pressure, k is a constant to convert gas volumes, $C_{c'O2}$ is end-capillary $O_2$ content, and $C_{VO2}$ is mixed venous $O_2$ content. $CVO_2$ is calculated from numerical $O_2$ and $CO_2$ dissociation curves (see e.g., Olszowka et al., In: *Pulmonary Gas Exchange* (1st ed.), J B West (ed.), Academic Press, New York, New York, 1980, p. 263–306. The measured mixed venous $PO_2$, $PCO_2$, and pH. $C_{c'O2}$ is calculated from these curves, but the unknown $P_A CO_2$ is an implicit variable. Steady state mass balance on $CO_2$ exchange results in Equation 4.

$$((V_A/Q) \times (P_A CO_2)) = k(C_{VCO2}) - (C_{c'CO2}) \quad \text{(Equation 4)}$$

wherein $C_{c'CO2}$ is end-capillary $CO_2$ content, and $C_{VCO2}$ is calculated from numerical $O_2$ and $CO_2$ dissociation curves (see, e.g., Olszowka et al., 1980, supra). For $N_2$, a mass balance leads to Equation 5.

$$((V_I/Q) \times (P_I N_2)) - ((V_A/Q) \times (P_A N_2)) = \lambda_{N2}(P_A N_2) - (P_{VN2}) \quad \text{(Equation 5)}$$

wherein $P_I N_2$ and $P_A N_2$ are inspired and alveolar nitrogen partial pressures, respectively, $\lambda_{N2}$ is the blood gas partition coefficient for $N_2$, and $P_{VN2}$ is the mixed venous nitrogen partial pressure (calculated from a balance of mixed venous blood gas data). The requirement for all gas partial pressures to sum to barometric pressure leads to Equation 6.

$$(P_A O_2) + (P_A CO_2) + (P_A N_2) = P_B - P_{H2O} \quad \text{(Equation 6)}$$

wherein $P_B$ is barometric pressure and $P_{H2O}$ is water vapor pressure. Equations 5 and 6 are linear, and $P_A N_2$ and $VI/Q$ are eliminated by substitution, resulting in 2 equations, and in the two unknowns $V_A/Q$ and $P_A CO_2$. One equation is Equation 4. The second equation, after substituting appropriate expressions for $F_I O_2$ in place of $P_I O_2$ is Equation 7.

$$\frac{(V_A/Q) \times [P_I O_2 - F_I O_2 \times P_A CO_2 - P_A O_2)]}{(1 - F_I O_2) +} =$$
$$\lambda_{N2}(P_B - P_{H2O} - P_A O_2 - P_A CO_2 - P_{VN2})$$
$$k(C_{c'CO2} - C_{VCO2}) \quad \text{(Equation 7)}$$

In the forward problem, these two equations include implicit functions of both unknowns, $P_A O_2$—$P_A CO_2$. In the inverse problem, the additional simplification is that in both equations, functional dependence on $V_A/Q$ is explicit. Therefore, the system is simplified by eliminating $V_A/Q$ to give a single equation in one unknown, which is rearranged in the form $F(P_A CO_2) = 0$:

$$[k(C_{VCO2} - C_{c'CO2})/P_A CO_2][P_I O_2 - F_I O_2 \times P_A CO_2 - P_A O_2)]/(1 - F_I O_2) +$$
$$\lambda_{N2}(P_B - P_{H2O} - P_A O_2 - P_A CO_2 - P_{VN2}) -$$
$$k(C_{c'CO2} - C_{VO2}) = 0 \quad \text{(Equation 8)}$$

This equation contains two implicit and nonlinear functions of $P_A CO_2$ ($C_{c'CO2}$ and $C_{c'O2}$). It cannot be solved directly, but is solved iteratively by the secant method. The resulting $P_{ACO2}$ is inserted into either Equation (2) or Equation (5) for direct calculation of $V_A/Q$.

Imaging of Absolute Lung Perfusion (Q) Using Arterial Spin-tagging Method of Perfusion MRI The "arterial spin-tagging" (AST) methods for quantitative perfusion MRI are known (see, e.g., U.S. Pat. No. 5,402,785, Leigh and Alsop), and are exemplified in the preferred embodiments of the invention. However, perfusion data is also provided by gadolinium based methods, or by any recognized method presently known or yet to be developed, so long as the V and Q imaging methods are combined. A brief summary of the AST approach, as modified to perform lung perfusion imaging follows.

In the AST perfusion method, continuous magnetic labeling of the arterial water results in a small signal change that is a function of perfusion, arterial-capillary transit time, and regional blood volume. As shown by Zhang et al. (*Magn. Reson. Med.* 25:362–371 (1992)), a simplified model can be used to analyze the AST method. In this model, the Bloch equation (Detre et al., *Magn. Reson. Med.* 22:1–9 (1991)) is modified to include terms for perfusion, $f$, and exchange with a macromolecular pool and is given by:

$$\frac{dM_t}{dt} = \frac{M_t^0 - M_t}{T1_t} - k_{for} M_t + k_{rev} M_m + f M_a - f M_v \quad \text{(Equation 9)}$$

in which:
$f$=tissue-specific perfusion in $ml \ast g^{-1} \ast sec^{-1}$,
$T1_t$=spin-lattice relaxation time of tissue water,
$M_t$=longitudinal magnetization of water per gram of tissue,
$M_t^0$=equilibrium value of $M_t$,
$M_a$=longitudinal magnetization of water per ml of arterial blood,
$M_v$=longitudinal magnetization of water per ml of venous blood,
$M_m$=longitudinal magnetization of macromolecules per gram (g) of tissue,
$k_{for}, k_{rev}$=magnetization transfer rates between free tissue water and macromolecular water.

The tissue magnetization is measured under steady-state conditions of arterial labeling ($M_t^{inv}$) and under control conditions in which the blood flow is not labeled ($M_t^{con}$). Solving for the observed alteration in magnetization in terms of perfusion, $f$, leads to Equation 10:

$$\frac{\partial M}{M} = T1_{app} \exp\left(\frac{-\tau_1}{T1_b}\right) 2\alpha \left(\frac{f}{\lambda}\right) \quad \text{(Equation 10)}$$

where $\delta M/M$ is the observed fractional change in magnetization induced by arterial labeling, $\alpha$ is the degree of magnetic labeling of the inflowing blood, $\tau_1$ is the arterial-capillary transit time, $T1_b$ is the longitudinal relaxation time of the arterial blood, $\lambda$ is the tissue:blood partition coefficient, and $T1_{app}$, the "apparent T1", is defined by:

$$\frac{1}{T1_{app}} = \frac{1}{T1_t} + \frac{f}{\lambda} \quad \text{(Equation 11)}$$

in which $T1_t$ is the longitudinal relaxation time of the tissue. This model is then modified to include a term for the blood volume (Roberts, "Magnetic Resonance Imaging of Perfusion in Humans using Spin-Tagging of Arterial Water," Thesis, 1994, University of Pennsylvania, pp 58–60), yielding:

$$\frac{\partial M}{M} = \left(\frac{2\alpha f T1_{app} \exp\left(\frac{-\tau_1}{T1_b}\right)}{\lambda}\right)(1 - \nu) + \left(2\alpha \exp\left(\frac{-\tau_2}{T1_b}\right)\right)\nu \quad \text{(Equation 12)}$$

in which v is the fractional blood volume and $\tau_2$ is the transit time required for blood to reach the blood volume compartment. Equation 12 shows that the signal changes observed upon arterial labeling are a function of the tissue-specific perfusion, the fractional blood volume, the relaxation characteristics, and the transit times.

A variant of the AST method has recently been described which is relatively insensitive to variations in the transit time and regional blood volume. In this approach, continuous labeling is followed by a delay time, ω, during which unlabeled blood is allowed to "fill" the intravascular compartment at which point imaging occurs. Alsop et al. (*Radiology* 208(2):410–416 (1998) and *J. Cerebral Blood Flow & Metabol.* 16(6): 1236–1249 (1996)) have shown that in this approach perfusion may be calculated as:

$$\frac{\partial M}{M} = -TI_{app} \exp\left(\frac{-w}{TI_{app}}\right) \exp\left(-\tau_1\left[\frac{1}{TI_b} - \frac{1}{TI_{app}}\right]\right) 2\alpha\left(\frac{f}{\lambda}\right) \quad \text{(Equation 13)}$$

in which w is the acquisition delay. This modification, termed "transit-time insensitive AST" (TTI-AST) avoids the problems associated with measurement of the transit time and regional blood volume.

Spatial Co-registration of the Image Data

The images of V/Q and perfusion (Q) are typically obtained at separate times and during different phases of the respiratory cycle. For this reason, a "spatial co-registration" algorithm must be used to align the image data prior to calculation of ventilation.

Methods to solve the co-registration problem are known in the art. For example, one such method is based on the use of recognizable features within each data set, or "fiducials," to create a lattice of points. These points are then spatially-aligned using a "mesh-warping algorithm."

Specifically, the approach involves first globally aligning both MR images (in the following description, referred to as A and B). This comprises the following steps: (Step (a)) interpolate A and/or B so that they have the same voxel/pixel size. Let A1 and B1 be the resulting images. (Step (b)) Roughly align A1 with B1 so that the subsequent elastic matching step will not have to worry about global alignment. Several methods are known in the art that satisfy this step and would be recognized by a practitioner in the field of image computing and calculation.

The method used is based on the global mutual information of the joint histogram of A1 and B1. Such methods have been shown to yield very accurate and robust rigid registration, even when the relationship between the intensity patterns in the two images is very complex. Let A2 be the resulting image that is aligned in this global fashion with B1.

(Step (c)) This step performs elastic matching by local deformation. A2 is first divided into several sub-regions. The size of the sub-regions is and should be related to the degree of deformation that is expected between A2 and B1. Among these sub-regions, those containing the recognizable "fiducials" (structural information) were selected, e.g., lung boundaries or pulmonary vessels (which are identified either interactively or by segmentation).

Elastic registration is performed by optimizing the local image intensity correspondence of each selected sub-region as a function of its translation over B1. The required probabilities are obtained from the joint histogram of A2 and B2.

(Step (d)) Finally the previous step (Step (c)) yields an elastic transformation field. This field comprises a vector associated with every voxel v in A2 that indicates how v must be moved to obtain the corresponding voxel in B1. This information is then utilized to "undeform" A2 and create an image, A2=B2, that matches (voxel-by-voxel) image B1.

Finally, after performing the measurements and calculations comprising the steps above, the "three-dimensional quantitative images of lung ventilation" (in units $ml*g^{-1}*min^{-1}$) are computed.

The present invention is further described in the following examples. These examples are not to be construed as limiting the scope of the appended claims.

EXAMPLES

To confirm the effectiveness of the disclosed method, experiments were performed after informed consent was obtained from the patients using a medically approved protocol. Six patients were imaged. Three normal subjects, two patients with advanced emphysema, and one woman with a pulmonary embolus (PE), documented by history and V/Q scan, were selected to undergo magnetic resonance imaging. The two emphysema patients had each previously undergone single orthotopic lung transplantation (6 months and 5 years prior to imaging). Neither transplant patient had a baseline oxygen requirement, and both were free of respiratory symptoms at the time of imaging. Single lung transplant patients were chosen so that a direct comparison could be made between a severely obstructed and a relatively normal lung in the same patient. In all of the patients, chest radiographs showed no infiltrates or other active disease. The patient with PE was receiving intravenous heparin at the time of imaging. Ventilation imaging was not performed in this patient as the diagnosis of PE was confirmed with the AST perfusion scan alone.

In all subjects there were no apparent adverse effects from inhalation of the hyperpolarized helium gas. Blood pressure and oxygen saturation was continuously measured in the patients throughout the experiments. Oxygen saturations remained at all times greater than 96%.

Magnetic resonance data were acquired at the MR imaging (MRI) center of the Hospital of the University of Pennsylvania using a superconducting 1.5 Tesla imaging system equipped with high-powered gradients (Echospeed Signa, 5.6 revision software, GE Medical Systems, Milwaukee, Wis.). Proton imaging was performed at 63.8 MHz using a standard birdcage body coil for both signal transmission and reception. Helium imaging was performed at 48.65 MHz using a custom-built, broadband 26 cm diameter octagonal transmit/receive surface coil placed on the anterior thorax.

Pulmonary ventilation imaging was performed using hyperpolarized $^3$He (HP-$^3$He). The hyperpolarized gas was prepared through spin-exchange collisions with optically-pumped rubidium atoms. Helium was prepared by the metastability-exchange technique for one subject (Colegrove et al., *Phys. Rev.* 132:2561–2572 (1963); Gentile et al., *Phys. Rev. A.* 47:456–467 (1993); Happer et al., *Phys. Rev. A.* 29: 3092–3110 (1984); Ebert et al., *Lancet* 347:1297–1299 (1996); Saam, *Nat. Med.* 2:358–359 (1996)). Polarization levels of 5%–15% were achieved. After polarization, the gas was transferred to a plastic balloon that was then given to the subject lying in a supine position in the MRI magnet device. The subjects inhaled approximately 750 cc of the HP-$^3$He gas to near total lung capacity and breathing was held for approximately 15–30 seconds to permit imaging of the ventilation while the HP-$^3$He gas was held in the lungs and pulmonary system. Breathing was resumed for the perfusion analysis. Once the breath-hold has been exhaled, no further ventilation signal (HP-$^3$He) is obtained.

To ensure that sufficient magnetization would be left after all radiofrequency (RF) pulses used in the imaging pulse sequence, a nominal constant flip angle of 12° was applied. The repetition time (TR) was selected to be as short as possible as to reduce depolarization due to the presence of $O_2$. The echo-time (TE) was also chosen to be as short as possible in order to minimize unwanted echo attenuation due to the high diffusion of the noble gas. The imaging parameters were as follows: TR=18 minutes, TE=3 minutes, matrix size 25×128, field-of-view (FOV)=40×40 cm, slice thickness=7 mm, and number of slices=3. The voxel resolution was 1.5×3×7 mm.

AST Perfusion Imaging. The AST perfusion data were acquired using a technique that had been previously described by Roberts et al., *Rad* 212(3):890–895 (1999). Specifically, a modified three-dimensional, compact gradient-echo pulse sequence was used used to acquire perfusion image data showing the radiofrequency (RF) and gradient ($G_x$, $G_y$, and $G_z$) waveforms (FIG. 1). The following parameters were used: TE=716 μs, TR=50 ms, 7 mm to 10 mm slice thickness, 40 cm to 48 cm FOV, and 256×64×16 matrix. The voxel resolution was 2×8×8 mm. A fractional echo was acquired using a 64 kHz receiver bandwidth.

An arterial labeling RF pulse was applied in the presence of a gradient to provide continuous magnetic labeling of pulmonary arterial blood flow. Trapezoidal gradient and RF pulses were placed in the interpulse interval in order to label blood flow according to the principle of flow-induced adiabatic fast passage (Dixon et al., *Magn. Reson. Med.* 3:454–462 (1986)). The offset frequency of the labeling pulse was adjusted in each case so that the location of the plane of arterial labeling intersects a pulmonary artery. The pulse, having an amplitude (Bi) of 24 mgauss and a duration (Ti) of 40 mseconds corresponding to a duty cycle of 80%, was applied during the time between the crusher/refocusing gradient pulses (C) and the beginning of the next excitation. The flip angle of the excitation pulse, α, was 30°. The time axis is not to scale.

The pulse sequence was triggered to the respiratory cycle to eliminate artifacts from breathing motion. The arterial labeling RF pulses and gradients were applied continuously in order to maintain a steady-state. Data acquisition was performed only during the end-expiratory phase of the cycle. Sixteen slab-encodings were acquired at end-expiration, requiring a temporal window of 0.8 seconds. Magnitude image data were acquired in the presence of arterial labeling ("inversion"), and under control conditions in which the amplitude of the label RF was set to zero ("control"). The acquisition of the entire perfusion data required less than 10 minutes per lung while the subject was breathing normally, but it could have been repeated without adverse effect on the data.

Figure 2:
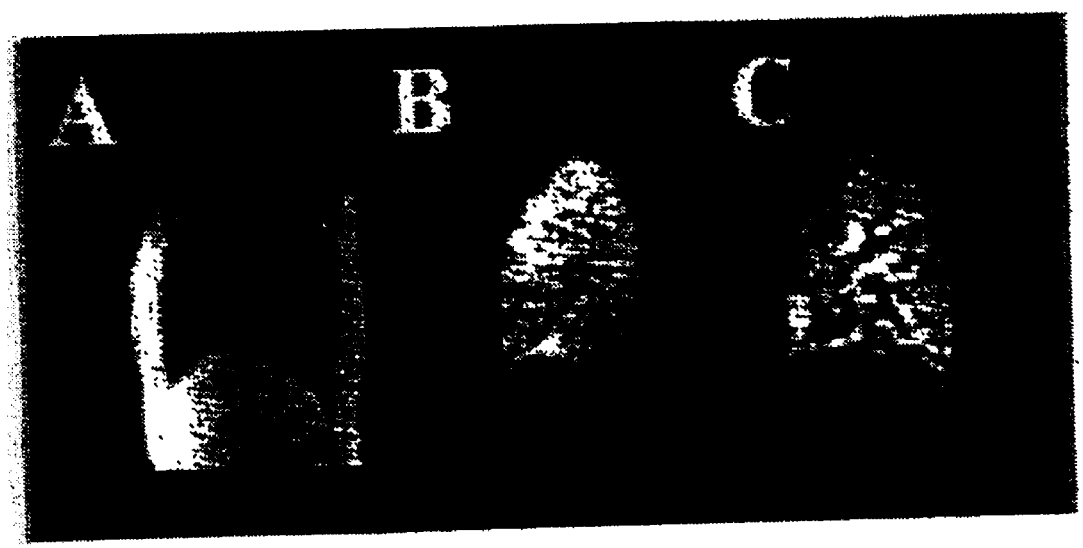
FIGS. 2A–2C depict the lung of a healthy male non-smoker.
Figure 3:
FIGS. 3A–3D depict corresponding proton (FIG. 3A) and $^3$He (FIG. 3B) coronal images of a patient with a history of emphysema. The patient had received a left lung transplant, and the $^3$He distribution in the transplanted left lung allograft was uniform. The $^3$He ventilation images show large defects in $^3$He distribution in the right (native) lung. Corresponding AST sagittal images perfusion images from the right native lung (FIG. 3C) show large defects in signal, while images of the left lung allograft (FIG. 3D) show bright signals from normal blood perfusion. Multiple slices may be obtained. Three images of the chest are shown for each view to cover a broad spatial range.

In the normal subjects, the ventilation and perfusion signal was homogeneous throughout the lung fields as shown in FIGS. 2A–2C. However, the gas distribution and perfusion signals in patients with emphysematous lungs were markedly non-uniform (FIG. 3), and paralleled radiographic and nuclear V/Q scan abnormalities. The hyperpolarized $^3$He gas distribution and perfusion signals appeared relatively uniform throughout the lung allografts, with apparent defects caused by the heart and large vessels. Sagittal perfusion images using the arterial spin tagging (AST) method showed bright signals, corresponding to increased perfusion in the lung allografts. The emphysematous right lungs revealed poor perfusion signals that were patchy and heterogeneous. A high level of ventilation and perfusion matching, confirmed with histogram analysis, was maintained in the single lung transplant recipients.

Figure 4:
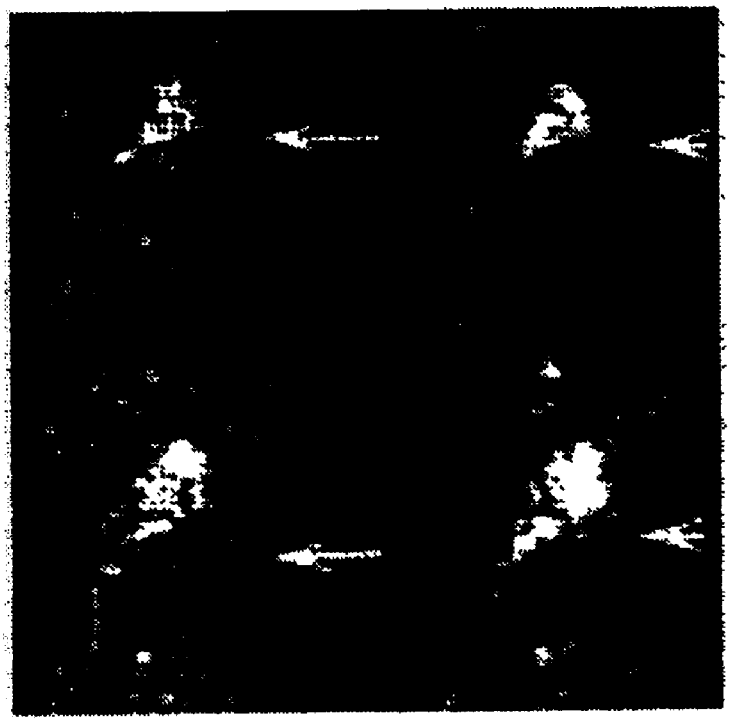
FIG. 4 depicts sagittal images of pulmonary perfusion obtained using the AST method in a patient with a large pulmonary embolus, documented by computer tomography (CT) in the right lower lobe pulmonary artery. The marked decreased perfusion signal in the lower lobe is shown with arrows. As in FIG. 3, multiple slices may be obtained of the lung. In this case four images are shown, but the selected number of images is not relevant.

A lower lobe wedge shaped perfusion defect, shown in FIG. 4, was observed in the patient with a large pulmonary embolus (PE), which was documented by computer tomography imaging (CT angiography) imaging in the right lower lobe pulmonary artery. Although treatment with anticoagulants had been initiated when the PE was diagnosed several hours prior to imaging by the present methods, there remained a marked decreased perfusion signal in the lower lobe (shown with arrows in FIG. 4).

In sum, the present invention demonstrates that it is feasible to combine the use of a hyperpolarized noble gas (for ventilation) and arterial spin-tagging (for perfusion) to produce high-resolution, three-dimensional images of pulmonary V/Q in human subjects using a noninvasive and nonradioactive MR technique.

Each and every patent, patent application and publication that is cited in the foregoing specification is herein incorporated by reference in its entirety.

While the foregoing specification has been described with regard to certain preferred embodiments, and many details have been set forth for the purpose of illustration, it will be apparent to those skilled in the art without departing from the spirit and scope of the invention, that the invention may be subject to various modifications and additional embodiments, and that certain of the details described herein can be varied considerably without departing from the basic principles of the invention. Such modifications and additional embodiments are also intended to fall within the scope of the appended claims.

We claimed:

1. A quantitative method for very high resolution, three-dimensional combined imaging of pulmonary ventilation (V) and perfusion (Q), synchronously (V/Q), wherein the method comprises delivering a predetermined volume of hyperpolarized noble gas into the conducting airways in each ventilated region of the pulmonary system, collecting local magnetic resonance image data from said hyperpolarized noble gas to produce a V/Q image data set, three-dimensionally, quantitatively imaging absolute lung perfusion (Q), and collecting local magnetic resonance image data from said perfusion imaging to produce an absolute lung perfusion image data set.

2. The method of claim 1, wherein the noble gas is hyperpolarized helium-3 gas (HP-$^3$ He).

3. The method of claim 1, wherein the imaging of absolute lung perfusion (Q) comprises a gadolinium based method.

4. The method of claim 1, wherein the imaging of absolute lung perfusion (Q) comprises an arterial spin-tagging method.

5. The method of claim 1, further comprising the step of using a co-registration algorithm to spatially co-register the MR image V/Q data set with data set Q, comprising the quantitative lung perfusion.

6. The method of claim 5, further comprising dividing the image into as many distinct voxels as imaging resolution permits.

7. The method of claim 6, further comprising computing absolute ventilation (V) by multiplying the ventilation/perfusion ratio (V/Q) by perfusion (Q) for each point in the lung image.

8. The method of claim 7, further comprising applying the method to the pulmonary system of a mammalian subject.

9. The method of claim 8, wherein the mammalian subject is human.

10. The method of claim 9, wherein the lung is normal.

11. The method of claim 9, wherein the lung is injured or diseased.

12. The very high resolution three-dimensional images of pulmonary ventilation, produced by the method of claim 7 using hyperpolarized HP-$^3$He gas.

* * * * *